Oct. 8, 1968 KEISUKE YAWATA ET AL 3,405,224

SEALED ENCLOSURE FOR ELECTRONIC DEVICE

Filed April 19, 1967 2 Sheets-Sheet 1

INVENTORS
KEISUES YAWATA
HIROSHI SHIBA
BY
Hopgood & Calimafde
ATTORNEYS

INVENTORS
KEISUKE YAWATA
HIROSHI SHIBA
BY
Hopgood & Calimafde
ATTORNEYS

United States Patent Office 3,405,224

Patented Oct. 8, 1968

3,405,224

SEALED ENCLOSURE FOR ELECTRONIC DEVICE

Keisuke Yawata, Hiroshi Shiba, and Shinzo Anazawa, Tokyo, Japan, assignors to Nippon Electric Company Limited, Tokyo, Japan, a corporation of Japan Filed Apr. 19, 1967, Ser. No. 632,089
Claims priority, application Japan, Apr. 20, 1966, 41/25,054
2 Claims. (Cl. 174—52)

ABSTRACT OF THE DISCLOSURE

An enclosure for hermetically encapsulating a micro-miniature electronic device which utilizes an oxide film of good adhesive quality between metal lead wires for the device and a substrate provided as a portion of the enclosure.

*Background of the invention*

With the advance of the semiconductor device and the microminiaturization of circuits, microminature electronic circuits have been developed and used in electronic computer and communication applications in large quantities. There are a number of requirements for such microminiature electronic circuits such as the reduction of dimensions to sizes as small as possible, light weight, rigidness and low cost. Since semiconductor devices and microminiature electronic circuits usually are assembled in an enclosure and sealed from the atmosphere, the enclosure must also satisfy the requirements of being hermetically sealed.

Known structures for a hermetic enclosure for such devices include (1) an assembly comprising a metal can, insulating material such as glass, and lead wires, (2) an assembly of ceramic, glass and lead wires, and (3) an assembly including glass and lead wires. One preferred prior art hermetic enclosure for microminiature electronic circuits comprises a substrate on which at least the top surface is composed of glass or devitrified ceramic, metal lead wires disposed on the top surface of the substrate, a lid arranged to cover portions of the top surface and lead wires, and sealing glass at the contact portion between the lid and the top surface of the substrate and between the lid and the metal lead wires, whereby a semiconductor device or microminiature electronic circuit is enclosed. However, neither this preferred prior art enclosure, nor any other conventional enclosure completely satisfies the requirements set forth above. Moreover, in a conventional enclosure which has such a structure that the surface of the lead wires is lower than the surface of the semiconductor device disposed in the enclosure, a wire interconnecting the semiconductor device and lead wires may touch an exposed portion of the device, causing undesirable electrical contact, with consequent improper operation of the device. Furthermore, it has been rather difficult to maintain the desired lead wire dimension accuracy in the conventional hermetic enclosure for microminiature electronic circuits.

*Objects of the invention*

It is one object of this invention to provide a hermetic enclosure for a microminiature electronic circuit which has the features of sufficiently small dimensions, light weight and rigidity.

It is another object of the present invention to provide a hermetic enclosure for a microminiature electronic circuit which facilitates the assembly of a semiconductor device using fine lead wires for interconnection without making undesirable electrical contact with the device.

Yet another object of this invention is to provide good control of the dimensional accuracy in the manufacturing process of a hermetic enclosure for a microminiature electronic circuit.

Still another object of the present invention is to provide a high reliability device comprising a microminiature electronic circuit in a hermetically sealed enclosure.

A further object of the invention is to provide a hermetic enclosure for a microminiature electronic circuit wherein the electrical connections between the semiconductor device and the external leads is made without interconnecting wires.

Another object of the invention is to provide a hermetic enclosure for a microminiature electronic circuit wherein the manufacturing cost is inherently low.

A still further object of the invention is to provide an improved hermetic enclosure for a microminiature electronic circuit.

All of the objects, features and advantages of this invention and the manner of attaining them will become more apparent and the invention itself will be best understood by reference to the following description of the invention taken in conjunction with the accompanying drawing.

*Brief description of the drawing*

In all of the figures shown, the same numeral refers to the same or equivalent parts.

*Summary of the invention*

The hermetic enclosure in accordance with the present invention is basically characterized by the presence of a metal oxide film between the metal lead wires and the top surface of the substrate, or between the metal lead wires and the sealing glass of the hermetic enclosure of the preferred prior art type referred to above. Examples of the metal oxide includes chromium oxide ($Cr_2O_3$), aluminum oxide ($Al_2O_3$) and silicon dioxide ($SiO_2$), any of which forms a stable and very thin film and has good adhesion to metal and glass. The present invention provides a small, rigid and hermetic enclosure utilizing the adhesion between the metal oxide and the metal lead wire and that between the metal oxide and the glass, and is especially useful for encapsulating semiconductor integrated circuits, thin film integrated circuits and hybrid integrated circuits.

*Description of preferred embodiments*

The present invention will now be described in detail, referring specifically to the accompanying drawings for a better understanding of the foregoing and other characteristics of the invention.

Figure 1A:
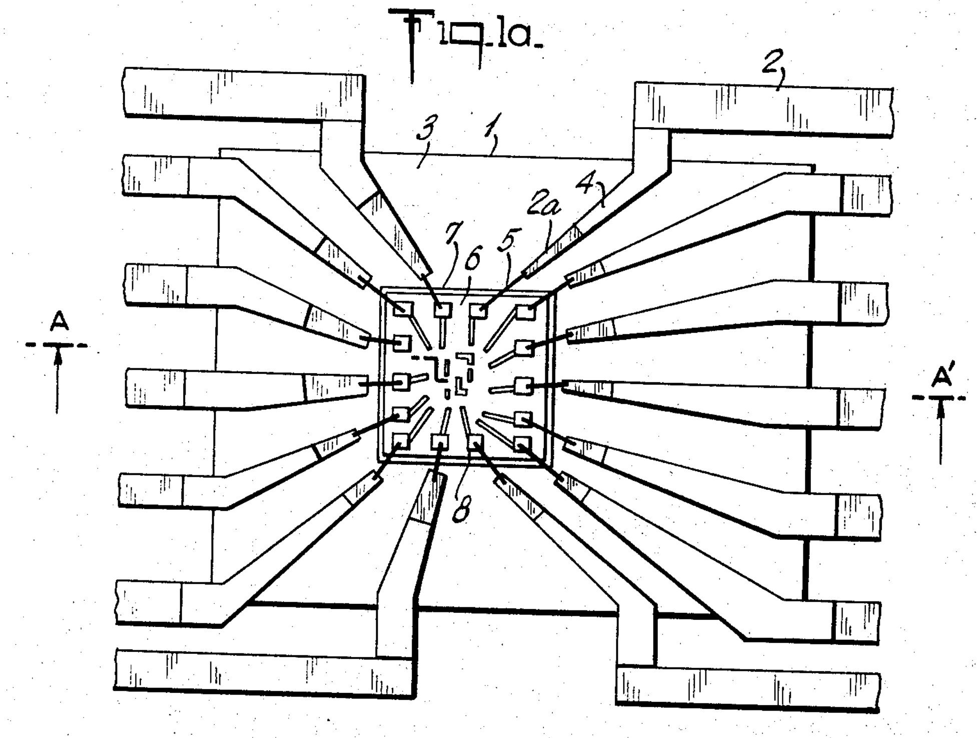
FIGS. 1*a* and 2*a* show plan views of an enclosure with the lid removed, of first and second embodiments, respectively, of a hermetically sealed enclosure in accordance with the present invention.
Figure 1B:
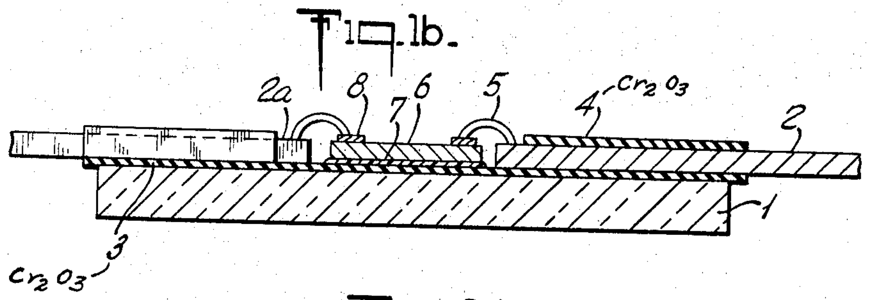
FIGS. 1*b* and 2*b* are cross sectional views of the enclosure shown in FIGS. 1*a* and 2*a*, respectively, sectioned along the line A—A of FIG. 1*a* and the line B—B of FIG. 2*a*, as seen when looking in the direction of the arrows.

In the first embodiment of the invention shown in FIGS. 1*a* and 1*b*, a glass substrate 1 is covered with a chromium oxide film 3. External lead wires 2 are attached to the substrate 1 with the chromium oxide film 3 therebetween. The top surfaces of the lead wires 2, i.e., those surfaces opposite the surfaces attached to the chromium oxide 3, are partly covered with a chromium oxide film 4. Such a structure may be obtained by the exemplary method now to be described. Both surfaces of a plate comprising a 48% iron-52% nickel alloy are first coated with chromium and this chromium coating is then oxidized to form a very thin chromium oxide film on opposite sides of the alloy plate, with traces of the chromium coating remaining. The plate is then affixed to a glass substrate at a temperature above the softening point of the glass. Selected areas of the upper chromium oxide film 4 are then removed between other preselected portions reserved for the external lead wires 2, leaving areas of the iron-nickel alloy exposed. The exposed iron-nickel alloy areas are then removed, such as by etching, for example, the reserved preselected portions of chromium oxide film acting as a mask against the etchant. The result is the formation of the lead wires 2 and also the provision of a central region to receive a semiconductor chip, as will appear. Further portions of the chromium oxide film 4 are then removed selectively to provide exposed ends 2*a* of the lead wires 2. As is well known, the glass 1 and metal oxide film 3 form a very strong bond by adhesion.

The hermetic enclosure construction in accordance with the present invention utilizes the adhesion between the chromium oxide film 3 and the glass 1 and also that between the chromium oxide film 3 and the iron-nickel alloy wires 2 containing chromium. The latter is described in an article by Manabu Sagara in the publication "Metal Surface Technology," vol. 15, No. 6, 1964, pp. 235–238, according to which the adhesion provides a very strong bond due to the characteristics of the oxide film and iron-nickel alloy.

By encapsulating the structure shown in FIGS. 1*a* and 1*b* with a lid 10 (See FIG. 3), having a recess therein and sealing the substrate and lid together with glass, the sealing of the entire structure is exclusively a glass-chromium oxide film-iron nickel alloy seal, or a glass-chromium oxide film glass seal, as desired. As a result, the hermetic enclosure in accordance with the present invention provides an extremely reliable hermetic seal suitable for microminiature electronic circuits.

In FIGS. 1*a* and 1*b* a chip 6 comprising a microminiature electronic circuit, for example a semiconductor integrated circuit, is attached to the center portion of the structure by means of a low melting point glass 7, and electrodes 8 of the chip 6 are connected by lead wires 5 to the end portions 2a of the external lead wires 2 from which the oxide film has been removed as described above.

Figure 2A:
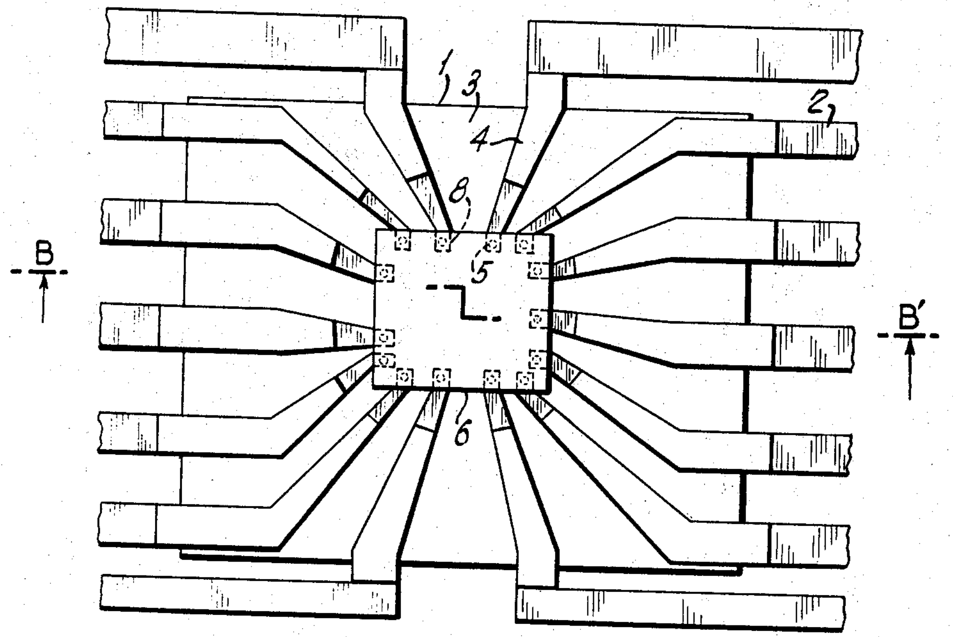
Figure 2B:
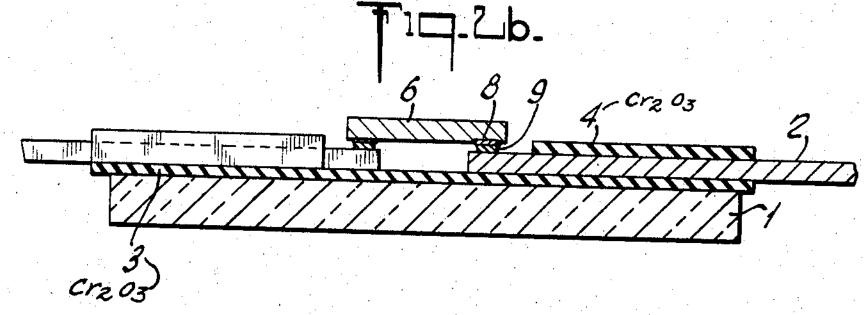

According to the second embodiment of the present invention shown in FIGS. 2*a* and 2*b*, a glass substrate 1, a chromium oxide film 3, external lead wires 2 and a chromium oxide film 4 are arranged in the same manner as in the first embodiment. A chip 6 comprising a microminiature electronic circuit, for example a semiconductor integrated circuit, is attached to the lead wires 2 with small metal pieces 9 such as solder and provide an electric path between the electrodes 8 and lead wires 2. The lead wires 2 are arranged in mirror symmetry to the geometry of the electrodes 8 so that each electrode 8 is readily connected to its lead wire 2 with its metal pieces 9. The small metal pieces 9 are of metal having a high electric conductivity and suitable for thermocompression bonding, such as tin or a lead-tin alloy, which makes the necessary electrical connection between the electrodes and lead wires even if the surface of the lead wires 2 and/or the surface of the chip is not on the same plane. The chromium oxide film 4 over the lead wires 2 prevents direct contact of the lead wires with the exposed edge of the circuit chip by reason of its insulating property.

Figure 3:
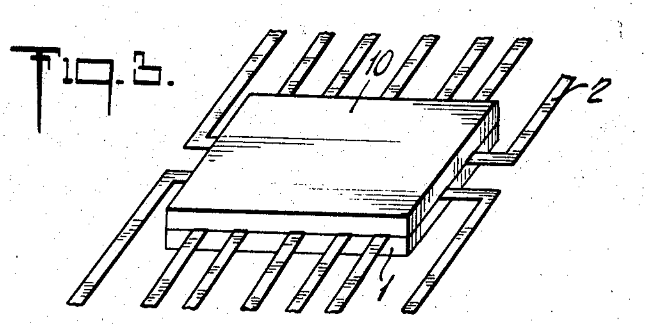
FIG. 3 is a perspective drawing of the hermetically sealed enclosure of FIGS. 1*a*, 1*b* and 2*a*, 2*b* showing its finished appearance.

The hermetic enclosure for the microminiture electronic circuit in accordance with the second embodiment of the present invention is also completed by attaching a lid 10 as shown in FIG. 3. The lid 10 may be of ceramic, glass, or metal sealed to the substrate 1 with glass therebetween around the periphery thereof, the sealing being hermetic. Such a structure having a substrate with dimensions of 3.3 mm. x 7 mm. (⅛" x ¼") and lead wire thickness and width of 0.08 mm. (0.0032") and 0.35 mm. (0.014"), respectively, may easily be achieved according to the present invention, thus providing a rigid and hermetic enclosure suitable for applications where high reliability is required.

Figure 4:
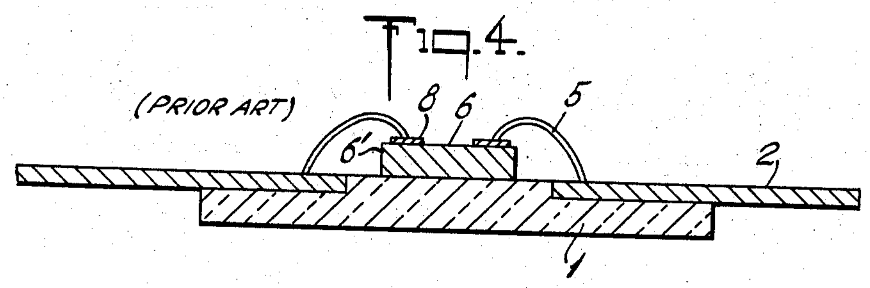
FIG. 4 is a cross-sectional view of one example of the internal assembly structure of a conventional semiconductor device.

Reference is now made to FIG. 4, which shows a conventional semiconductor device. In such a conventional device, if the enclosure has such a construction that the top surface of the semiconductor element 6 is higher than the top surface of the external lead wires 2, the fine wires 5 interconnecting the electrodes 8 of the semiconductor element and the external lead wires 2 may touch an edge 6′ of the element 6 causing an undesirable electrical contact.

According to the first described embodiment of the present invention, however, the hermetic enclosure has a construction such that the top surface of the external lead wires 2 and the top surface of the semiconductor element 6 are approximately on the same level as shown in FIG. 1*b*, thus eliminating the possibility of an undesirable contact between the interconnecting wires and semiconductor element. This feature is also provided in the structure of the second embodiment of the present invention shown in FIG. 2*b*.

The resulting uniformity of thickness of the lead wire dimensions is extremely high when the external lead wires 2 are formed by etching as described with reference to the foregoing embodiments of this invention. This feature is important as it reduces manufacturing cost, improves reliability and facilitates the manufacturing operation.

The present invention has been described with reference to specific embodiments only for the purpose of clarifying the disclosure and it will be appreciated that various modifications will occur to those skilled in the art, which fall within the scope of the invention. For example, aluminum oxide, silicon dioxide or other suitable metal oxide may be used in place of chromium oxide, to form a very thin and stable film and to provide good adhesion with glass and metal. The metal oxide film is preferably formed on both the upper and lower surfaces of the external lead wires 2 to be sealed. Moreover, the substrate may be ceramic or metal having a glass layer formed thereon, and also the configuration of the substrate and lead wires, and the arrangement of the microminiature circuit chip on the substrate may be reversed or modified as desired within the concept of this invention.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A hermetic enclosure comprising
a substrate with at least the top surface thereof being glass,
metal lead wires attached to said substrate top surface,
a lid with a recess attached to a portion of said substrate top surface and a portion of said lead wires,
at least the portion of said lid contacting and sealing said portion of the substrate top surface and said portion of said lead wires being of sealing glass,
a microminiature electronic circuit disposed within said enclosure and electrically connected to said lead wires,
said electronic circuit including a semiconductor element,
said latter element being secured to a metal oxide film covering the substrate top surface,
the electrodes of said element being interconnected with said lead wires with fine metal wires,
said hermetic enclosure further including metal oxide bonding films between the glass and said metal lead wires, and said metal oxide films forming sealing and bonding means for said enclosure by utilizing the adhesion between the glass and said metal oxide films and between the metal of said lead wires and said metal oxide films.

2. A hermetic enclosure comprising a substrate with at least the top surface thereof being glass, metal lead wires attached to said substrate top surface, a lid with a recess attached to a portion of said substrate top surface and a portion of said lead wires, at least the portion of said lid contacting and sealing said portion of the substrate top surface and said portion of said lead wires being of sealing glass, a microminiature electronic circuit disposed within said enclosure and electrically connected to said lead wires, said electronic circuit including a semiconductor element, said latter element being secured to a metal oxide film covering the substrate top surface, the electrodes of said element being interconnected with said lead wires with fine metal wires, the thickness of said lead wires being such that the upper surfaces of said lead wires are at least as high as the upper surface of said semiconductor element, asid fine metal wires which interconnect the electrodes of said element with said lead wires being positioned relative to said element so as to eliminate undesirable contact with exposed portions of said element at the periphery thereof, said hermetic enclosure further including metal oxide bonding films between the glass and said metal lead wires, and said metal oxide films forming sealing and bonding means for said enclosure by utilizing the adhesion between the glass and said metal oxide films and between the metal of said lead wires and said metal oxide films.

References Cited

UNITED STATES PATENTS

| | | | |
|---|---|---|---|
| 2,446,277 | 8/1948 | Gordon | 174—50.63 |
| 2,555,877 | 6/1951 | Doran | 174—50.61 |
| 3,341,649 | 9/1967 | James | 174—52 |

DARRELL L. CLAY, *Primary Examiner.*